US006487699B1

(12) United States Patent
Devins et al.

(10) Patent No.: US 6,487,699 B1
(45) Date of Patent: Nov. 26, 2002

(54) METHOD OF CONTROLLING EXTERNAL MODELS IN SYSTEM-ON-CHIP VERIFICATION

(75) Inventors: Robert J. Devins, Essex Junction, VT (US); Robert D. Herzl, South Burlington, VT (US); David W. Milton, Underhill, VT (US); Clarence R. Ogilvie, Huntington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/494,230

(22) Filed: Jan. 31, 2000

(51) Int. Cl.$^7$ ............................................... G06F 17/50
(52) U.S. Cl. ................................. 716/4; 716/5; 703/16; 703/17
(58) Field of Search ...................... 716/4, 5; 703/13–17

(56) References Cited

U.S. PATENT DOCUMENTS

| | | | | |
|---|---|---|---|---|
| 5,600,579 | A | 2/1997 | Steinmetz, Jr. | ............. 364/578 |
| 5,838,948 | A | 11/1998 | Bunza | ......................... 395/500 |
| 6,052,524 | A | * 4/2000 | Pauna | .................... 395/500.43 |
| 6,240,543 | B1 | * 5/2001 | Bhandari | ...................... 716/18 |
| 6,249,893 | B1 | * 6/2001 | Rajsuman et al. | .......... 714/741 |
| 6,269,467 | B1 | * 7/2001 | Chang et al. | ................... 716/1 |

OTHER PUBLICATIONS

Shah et al, "Target Processor and Co–Verification Environment Independent Adapter—A Technology to Shorten Cycle–Time For Retargeting T1 Processor Simulators In HW/SW Co–Verification Environments," IEEE, Sep. 1999, pp. 37–41.*

Clement et al, "Fast Prototyping: A System Design Flow Applied to a Complex System–on–Chip Multiprocessor Design," IEEE, Jun. 1999, pp. 420–424.*

Bill Cordan, "An Efficient Bus Architecture for System–on–Chip Design," IEEE, May 1999, pp. 623–626.*

Arnold S. Berger, "Applying Hardware/Software Co–Design to Systems–on–a–Chip," IEEE, Sep. 1998, pp. 22–28.*

Chauhan et al, "Verifying IP–Core Based System–On–Chip Designs," IEEE, Sep. 1999, pp. 27–31.*

Bulent Dervisoglu, "Design For Testability: It is Time to Deliver it for Time–to–Market," IEEE, Sep. 1999, pp. 1102–1111.0.*

* cited by examiner

*Primary Examiner*—Vuthe Siek
(74) *Attorney, Agent, or Firm*—Connolly Bove Lodge Hutz, LLP; R.M. Kotulak

(57) ABSTRACT

A method, system and media for communicating with and controlling design logic modules ("cores") which are external to a system-on-chip ("SOC") design during verification of the design. An external memory-mapped test device ("EMMTD") is coupled between a SOC design being tested in simulation, and cores external to the SOC design. Internal logic in the EMMTD provides for control and status monitoring of an external core coupled to an EMMTD bi-directional bus by enabling functions including driving data on the bus, reading the current state of data on the bus, and capturing positive and negative edge transitions on the bus.

41 Claims, 3 Drawing Sheets

METHOD OF CONTROLLING EXTERNAL MODELS IN SYSTEM-ON-CHIP VERIFICATION

CROSS REFERENCE TO RELATED APPLICATIONS

This application is related by common inventorship and subject matter to co-pending applications titled "Simulator-Independent System-On-Chip Verification Methodology", "Method of Developing Re-Usable Software for Efficient Verification of System-On-Chip Integrated Circuit Designs", "Method for Efficient Verification of System-On-Chip Integrated Circuit Designs Including an Embedded Processor", "Processor-Independent System-CA-Chip Verification for Embedded Processor Systems", and "Method for Re-Using System-On-Chip Verification Software in an Operating System". The foregoing applications are assigned respectively the following application numbers by the U.S. Patent and Trademark Office. Ser. No. 09/494,565; Ser. No. 09/494,907; Ser. No. 09/494,564; Ser. No. 09/494,386; Ser. No. 09/494,236. The listed applications are assigned to International Business Machines Corporation and are entirely incorporated herein by this reference.

BACKGROUND OF THE INVENTION

The present invention relates to the testing of computer system designs by software simulation, and more particularly to a verification methodology for system-on-chip (SOC) designs which provides for controlling design elements external to an SOC.

The complexity and sophistication of present-day integrated circuit (IC) chips have advanced significantly over those of early chip designs. Where formerly a chip might embody relatively simple electronic logic blocks effected by interconnections between logic gates, currently chips can include combinations of complex, modularized IC designs often called "cores" which together constitute an entire "system-on-a-chip", or SOC.

In general, IC chip development includes a design phase and a verification phase for determining whether a design works as expected. The verification phase has moved increasingly toward a software simulation approach to avoid the costs of first implementing designs in hardware to verify them.

A key factor for developers and marketers of IC chips in being competitive in business is time-to-market of new products; the shorter the time-to-market, the better the prospects for sales. Time-to-market in turn depends to a significant extent on the duration of the verification phase for new products to be released.

As chip designs have become more complex, shortcomings in existing chip verification methodologies which extend time-to-market have become evident.

Typically, in verifying a design, a simulator is used. Here, "simulator" refers to specialized software whose functions include accepting software written in a hardware description language (HDL) such as Verilog or VHDL which models a circuit design (for example, a core as described above), and using the model to simulate the response of the design to stimuli which are applied by a test case to determine whether the design functions as expected. The results are observed and used to de-bug the design In order to achieve acceptably bug-free designs, verification software must be developed for applying a number of test cases sufficient to fully exercise the design in simulation.

In the case of SOC designs, the functioning of both the individual cores as they are developed, and of the cores interconnected as a system must be verified. Moreover, a complete SOC design usually includes an embedded processor core; simulation which includes a processor core tends to require an inordinate amount of time and computing resources, largely because the processor is usually the most complex piece of circuitry on the chip and interacts with many other cores.

It can be appreciated from the foregoing that verification of an SOC can severely impact time-to-market, due to the necessity of developing and executing software for performing the numerous test cases required to fully exercise the design.

However, inefficiencies in current verification methodologies exacerbate time pressures. For example, SOC designs typically interface with cores that are external to the design. Existing methods of including such external cores in a verification test of a SOC design typically entail having to create special test cases to control the external cores; such test cases typically do not communicate with test cases being applied internally to the SOC and therefore lack realism. Calls to built-in simulator functions to control external cores are also used. However, such an approach is simulator-dependent and therefore not portable across simulators.

A verification methodology is needed which addresses the problems noted in the foregoing, which represent factors extending time-to-market.

SUMMARY OF THE INVENTION

The present invention provides a method for communicating with and controlling cores which are external to a SOC design during verification of the design, which avoids the above-noted inefficiencies in existing verification methods. According to the method, an external memory-mapped test device (EMMTD) is coupled between a SOC design being tested in simulation, and cores external to the SOC design. The EMMTD is coupled to the SOC via a chip-external bus, and coupled to external cores, or to the external interfaces of cores internal to the SOC, via an EMMTD bi-directional bus.

The EMMTD processes signals received over the chip external bus and applies them to an external core, or to an internal core with an external interface, coupled to the EMMTD bi-directional bus. Internal logic in the EMMTD provides for control and status monitoring of a core coupled to the EMMTD bi-directional bus by enabling functions including driving data on the bus, reading the current state of data on the bus, and capturing positive and negative edge transitions on the bus.

A test case being executed for SOC verification by a simulated embedded processor in the SOC can communicate with and control elements external to the SOC, by using the EMMTD to perform such functions as initiating external core logic which drives test signals to an internal core, directly controlling an internal core via its external interface, or determining the status of an external core.

The EMMTD may also be physically embodied in, for example, an FPGA (Field Programmable Gate Array) or an ASIC (Application Specific Integrated Circuit) usable with real hardware.

DETAILED DESCRIPTION OF THE INVENTION

Figure 1:
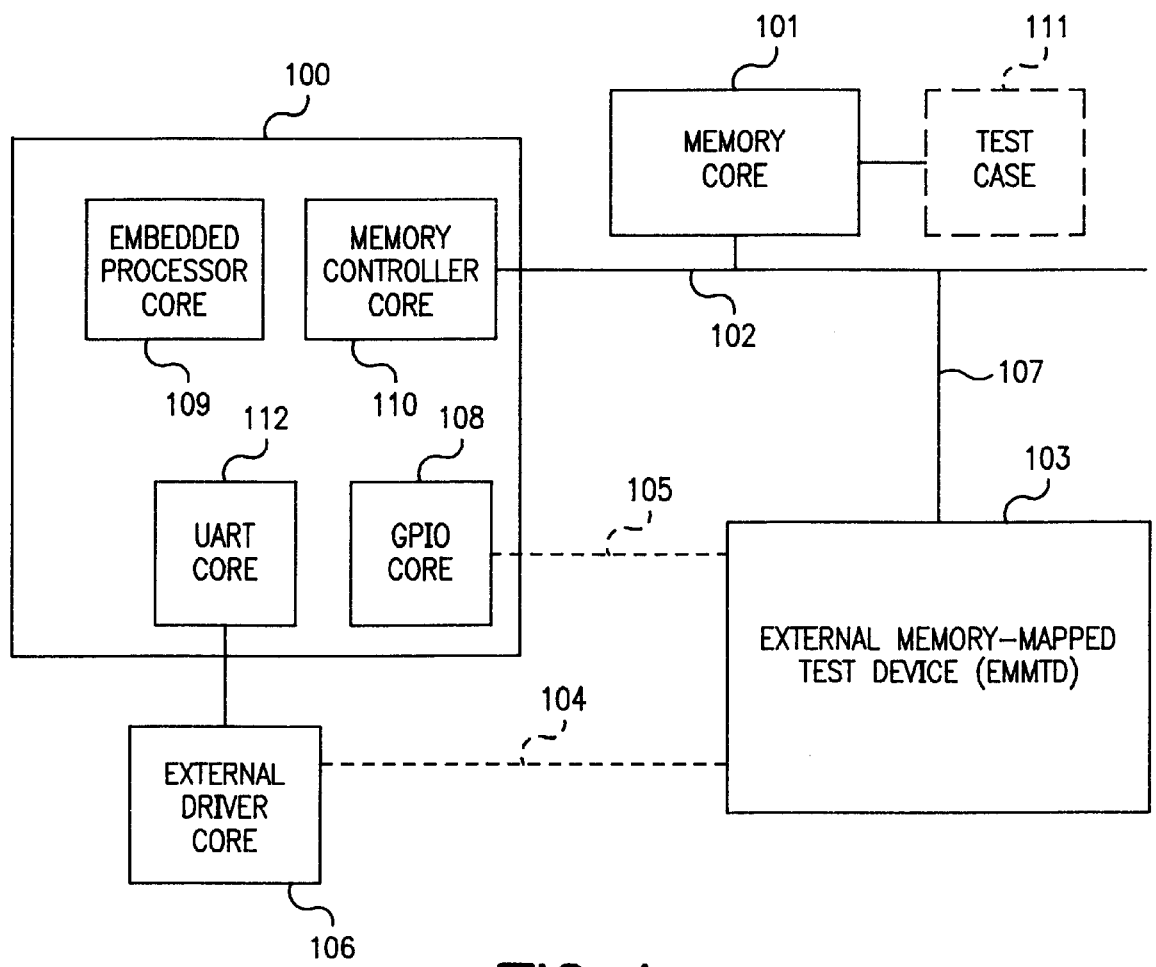
FIG. 1 shows an example of a system-on-chip (SOC) design having external cores, which are communicated with/controlled by the EMMTD according to the present invention in response to a verification test case.

FIG. 1 shows an example of components of a SOC design 100; the representation is intended to include embodiments in any known form of logic design, including simulatable HDL modules and netlists, and physical implementations. The SOC 100 includes a memory controller core 112 coupled via a memory bus 102 to a memory core 101 which is external to the chip 100. The SOC 100 further includes a universal asynchronous receiver transmitter (UART) core 112 coupled to an external driver core 106 and a general purpose I/O core (GPIO) 108.

FIG. 1 shows an example of components of a SOC design 100; the representation is intended to include embodiments in any known form of logic design, including simulatable HDL modules and netlists, and physical implementations. The SOC 100 includes a memory controller core 110 coupled via a memory bus 102 to a memory core 101 which is external to the chip 100. The SOC 100 further includes a universal asynchronous receiver transmitter (UART) core 107 coupled to an external driver core 106 and a general purpose I/O core (GPIO) 108.

The EMMTD 103 is coupled to the memory bus 102 by connection 107, to an external interface of the SOC-internal core 108 by connection 105, and to the external driver core 106 by connection 104. In an embodiment where the cores are HDL modules being simulated by a simulator (not shown), the connections represent virtual connections implemented by code specifications. In a physical embodiment the connections represent wires.

Also shown in FIG. 1 is test case 111, representing computer-executable instructions loaded into memory core 101 and executed by processor core 109 to perform verification of the SOC design 100. In an embodiment where the cores shown in FIG. 1 are HDL modules being simulated, the test case 111 instructions generate stimuli to verify the design. The application of the test case typically produces, as output, results data representing the response of the simulated design which is compared to expected results, to determine whether the design functions as expected. The design may subsequently be revised to improve performance or de-bug errors.

Figure 2:
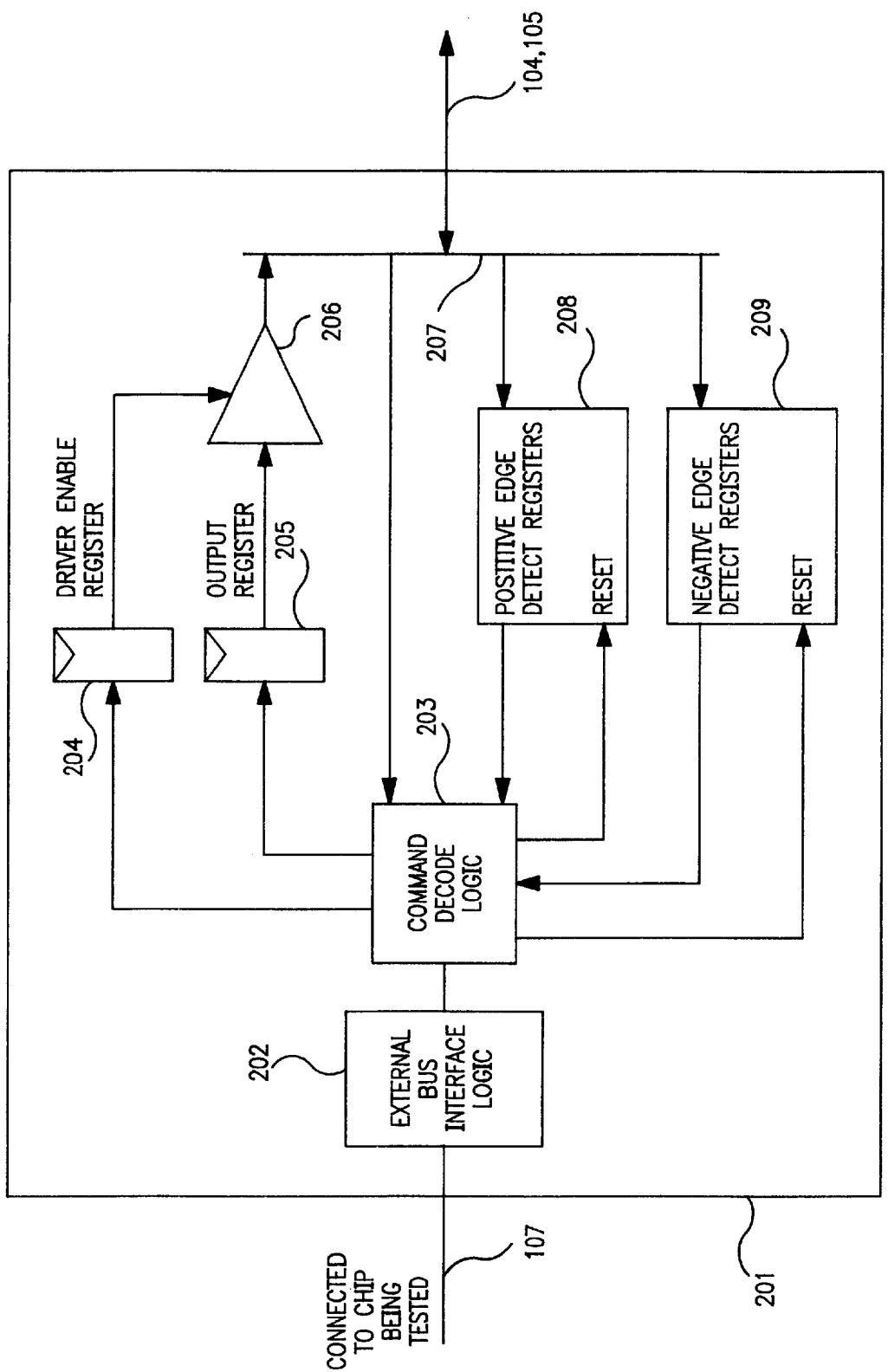
FIG. 2 shows the internal logic of the EMMTD.

In the case of an SOC design including multiple cores as shown in FIG. 1, it is typically desirable to simulate interaction among the component internal cores and external cores; the EMMTD helps to make this simulation more realistic by allowing the test case 111 to control and communicate with the external cores as well as the internal cores Internal logic in the EMMTD 103 is shown in FIG. 2 (as with FIG. 1, the representation is intended to include embodiments in any known form of logic design, including simulatable HDL modules and netlists, and physical implementations such as FPGAs or ASICs). The internal logic includes external bus interface logic 202 coupled to command decode logic 203. Command decode logic 203 has outputs coupled to driver enable register 204 and output register 205, positive edge detect register 208 and negative edge detect register 209, and has inputs from the latter two devices and from internal bus 207. Driver enable register 204 and output register 205 are input to driver 206, which is coupled to internal bus 207.

The EMMTD input connection 107 is connected to a chip-external bus, for example memory bus 102 as shown in FIG. 1. The bi-directional bus 207 of the EMMTD is represented by connections 104 and 105 to cores 106 and 108, respectively, corresponding to the example of FIG. 1. However, in general the bi-directional bus 207 may be as wide as desired; i.e., include as many wires as necessary to accommodate a desired number of cores to be communicated with/controlled. For each wire or bit on the bus, units 204, 205, 206, 207, 208 and 209 is replicated.

The format of the input received over connection 107 depends upon the bus protocol of the chip external bus, which could be of any known type; the SRAM (static random access memory), SDRAM (synchronous dynamic RAM) and Ethernet protocols are three examples. The external bus interface logic 202 is designed to direct signals received via connection 107 to the appropriate logical address, and to convert the particular bus protocol received into an internally-used format applicable to the command decode logic 203.

As noted above, the EMMTD may be used for control and status monitoring of a core coupled to the EMMTD bi-directional bus 207 in response to a test case being executed for SOC verification by a simulated embedded processor in the SOC. For example, because typically a UART handles asynchronous serial communication from an external source, a realistic way to simulate the operation of the UART core 112 in a test case is to use an external driver core such as 106 to drive data to the UART. Because the external driver core 106 is external to the chip 100, the processor core 109 executing the test case cannot communicate internally with the core 106. However, the test case can use the EMMTD to trigger the external driver core 106 to begin driving the data.

The triggering is accomplished, for example, by executing a write instruction addressed to the external drive core 106, which is applied to the EMMTD 103 via its connection 107 to memory bus 102. The external bus interface logic processes the write instruction according to the bus protocol used by bus 102, to direct it to the correct address and to convert it to an internally-used format which may be applied to command decode logic 203. The command decode logic 203 interprets the write instruction, and in response thereto, for example, drives signals to driver enable register 204 and output register 205. Output register 205 carries the data to be driven, while driver enable register 204 either enables or disables the driving of data. Thus, for example, if the command decode logic outputs a logic "1" to both registers 204 and 205, this causes a logic "1" to be output to the internal bus 207. Internal bus 207 may be coupled to a "start" bit on connection 104 to the external driver core 106. In response to receiving a logic "1" on its "start" input, the external driver core 106 begins to drive data into the UART core 112.

Typically, the UART core 112 transfers the data driven by the external driver core 106 to the memory core 101, and the test case subsequently checks the memory core for correct reception of the data. While waiting for the data transfer to complete, typically the test case, having triggered the external driver, will go on to do other work. This typically involves initiating other operations on other component cores of the SOC 100, or monitoring operations already in progress, including periodically polling the status of the external driver core 106 to determine whether the data transfer is complete.

When the external driver core 106 has finished driving data to the UART core 112, it generates a "complete" status signal, which may be coupled via connection 104 to internal bus 207, which, as shown in FIG. 2, is input to the command decode logic 203 (as noted above, the "start" and "complete" bits would be coupled to distinct replications of units 204, 205, 206, 207, 208 and 209). To poll for complete status, the test case may execute a read instruction which is directed to the correct address via the external bus interface logic 202. The read instruction obtains a "complete" status for the external driver core 106 from the command decode logic 203, and the test case goes on to check memory for correct reception of the data.

Positive edge and negative edge detect registers 208 and 209, respectively, can be used to capture transitions on the internal bus 207 from a logic "0" to a logic "1" and vice versa. The "reset" input from the command decode logic 203 allows these registers to be re-intialized as desired to record subsequent transitions. These registers provide additional status and history for attached logic which may be monitored and used for decision-making.

Another example of an application of the EMMTD is represented by connection 105 to the GPIO core 108. GPIO cores comprise general-use drivers and receivers for driving and receiving data from an attached bus. A test case being executed by the embedded processor core 109 might, for example, test the GPIO core 108 by issuing an instruction to the GPIO via its internal interface to write a specified value to its attached bus (here, connection 105), and use the EMMTD to verify that the specified value was in fact asserted on the bus, by reading the corresponding bit connected to internal bus 207 as described above. Similarly, the test case could instruct the EMMTD to drive data to the GPIO core 108, using the command decode logic 203, driver enable register 204 and output register 205 as described above. Then, the test case checks internally whether the GPIO core had received the specified data.

Examples have been described in which a test case uses the EMMTD to start an external core which then independently drives signals to an on-chip core, with the test case monitoring the status of the external core through the EMMTD, and in which the test case directly controls the testing of an internal core with an external interface, like the GPIO. In view of these examples, it can be appreciated an EMMTD according to the present invention provides a solution to the problem of communication with, and control of, external cores and internal cores with external interfaces in simulation, which has a very general application not limited to the foregoing examples. The EMMTD provides a generalized control and communication interface between an SOC and external logic which can be utilized for any number of applications, depending on the logic applied to the EMMTD.

Figure 3:
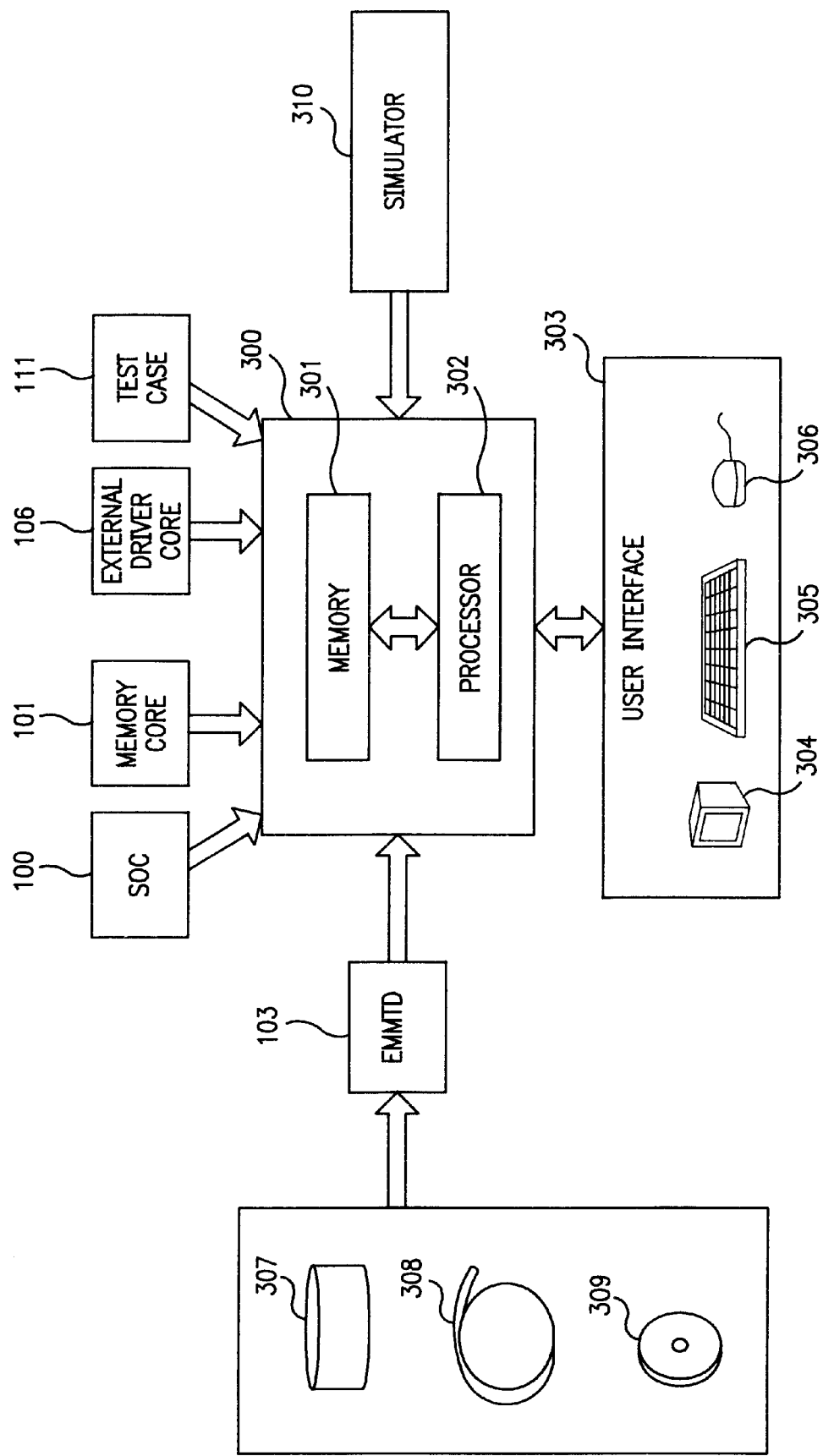
FIG. 3 shows a general purpose computer system for utilizing the EMMTD in simulation.

FIG. 3 illustrates a general purpose computer system which can be used to practice the invention. The system includes a computer 300 comprising a memory 301 and a processor 302 which may be embodied, for example, in a workstation. The system further includes a user interface 303 comprising a display device 304 and user-input devices such as a keyboard 305 and mouse 306 for purposes of, for example, and controlling a simulation session and observing simulation status and results.

The EMMTD 103, as noted above, may be implemented as a simulatable HDL module which may be stored on a computer-usable medium such as disk 307, tape 308 or CD-ROM 309. The EMMTD module may be read from a computer-usable medium as noted into the memory 301, concurrently with simulator (i.e., simulation software) 310, simulatable modules SOC 100, memory core 101, external driver core 106 and test case 111. The processor 302 executes the simulation software 310, using the input simulatable modules to simulate the behavior of corresponding hardware devices in response to instructions executed by test case 111, which typically is code specific to whatever processor is being simulated in SOC 100. The simulator 310 may be any of a variety of commercially-available simulators, including event simulators, cycle simulators and instruction set simulators.

The HDL logic corresponding to the EMMTD may also be processed by a logic synthesis tool to produce a gate-level description, which may then be implemented in physical device such as an FPGA or ASIC as is well-understood in the field of logic design. The FPGA or ASIC may be used in conjunction with a physical SOC to perform the same kinds of communication and control functions that the EMMTD provides in simulation.

The foregoing description of the invention illustrates and describes the present invention. The disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The invention claimed is:

1. A method for controlling design elements external to a system-on-chip design, comprising:
   executing software which generates a first signal to an element external to said system-on-chip design; and
   providing a hardware description language logic device coupled between said system-on-chip design and said external element, said device receiving said first signal and applying it to said external element.

2. The method of claim 1, wherein said device receives a second signal from said external device responsive to said first signal and relays it to said software.

3. The method of claim 2, wherein said first signal directs said external element to begin an independent test of an internal design component of said system-on-chip design.

4. The method of claim 3, further comprising monitoring the status of said independent test using said device.

5. The method of claim 1, wherein said device is further coupled to an external interface of an internal component of said system-on-chip design, and said software generates a signal via said internal component to said device, and monitors said device to determine whether said signal was correctly generated.

6. The method of claim 5, wherein said software generates a signal via said device to said internal component, and monitors said internal component to determine whether said signal was correctly generated.

7. The method of claim 2, wherein said device is coupled to said system-on-chip device via a chip-external bus, said device having internal logic comprising:
   external bus interface logic coupled to said chip-external bus, for interpreting a bus protocol corresponding to said chip-external bus;

command decode logic coupled to said external bus interface logic for interpreting said first signal; and driving means coupled to said command decode logic and an internal bus, for receiving an interpreted signal from said command decode logic and driving said interpreted signal onto said internal bus, said internal bus being coupled to said external element.

8. The method of claim 7, wherein said driving means comprises:

an output register coupled to a driver, for applying a data portion of said interpreted signal to said driver; and a driver enable register further coupled to said driver, for enabling and disabling the driving of said data portion by said driver onto said internal bus.

9. The method of claim 7, wherein said command decode logic is coupled to said internal bus, for receiving said second signal and relaying it to said software.

10. The method of claim 7, wherein said internal logic further includes:

a positive edge detect register coupled to said internal bus and said command decode logic, for capturing positive edge transitions on said internal bus; and a negative edge detect register coupled to said internal bus and said command decode logic, for capturing negative edge transitions on said internal bus;

said positive and negative edge detect registers being coupled to a reset input from said command decode logic, for resetting said registers.

11. The method of claim 1 wherein the device is a physical device.

12. A system for controlling design elements external to a system-on-chip design, comprising:

means for executing a test case which generates a first sign to an element external to said system-on-chip design; and a hardware description language logic device coupled between said system-n-chip design and said external element, said device receiving said first signal and applying it to said external element.

13. The system of claim 12, wherein said device receives a second signal from said external device responsive to said first signal and relays it to said software.

14. The system of claim 13, wherein said first signal directs said external element to begin an independent test of an internal design component of said system-on-chip design.

15. The system of claim 14, further comprising means for monitoring the status of said independent test using said device.

16. The system of claim 12, wherein said device is further coupled to an external interface of an internal component of said system-on-chip design, and further comprising means for generating a signal via said internal component to said device and monitoring said device to determine whether said signal was correctly generated.

17. The system of claim 16, further comprising means for generating a signal via said device to said internal component and monitoring said internal component to determine whether said signal was correctly generated.

18. The system of claim 13, wherein said device is coupled to said system-on-chip device via a chip-external bus, said device having internal logic comprising:

external bus interface logic coupled to said chip-external bus, for interpreting a bus protocol corresponding to said chip-external bus;

command decode logic coupled to said external bus interface logic for interpreting said first signal; and driving means coupled to said command decode logic and an internal bus, for receiving an interpreted signal from said command decode logic and driving said interpreted signal onto said internal bus, said internal bus being coupled to said external element.

19. The system of claim 18, wherein said driving means comprises:

an output register coupled to a driver, for applying a data portion of said interpreted signal to said driver; and a driver enable register further coupled to said driver, for enabling and disabling the driving of said data portion by said driver onto said internal bus.

20. The system of claim 18, wherein said command decode logic is coupled to said internal bus, for receiving said second signal and relaying it to said software.

21. The system of claim 18, wherein said internal logic further includes:

a positive edge detect register coupled to said internal bus and said command decode logic, for capturing positive edge transitions on said internal bus; and a negative edge detect register coupled to said internal bus and said command decode logic, for capturing negative edge transitions on said internal bus;

said positive and negative edge detect registers being coupled to a reset input from said command decode logic, for resetting said registers.

22. The system of claim 12 wherein the device is a physical device.

23. A computer-usable medium storing a simulatable software module comprising a description in a hardware description language, said module when simulated in conjunction with a system-on-chip design being exercised by software which generates a first signal to an element external to said system-on-chip design, simulates a hardware description language logic device coupled between said system-on-chip design and said exit element, said device receiving said first signal and applying it to said external element.

24. The computer-usable medium of claim 23, wherein said device receives a second signal from said external device responsive to said first signal and relays it to said software.

25. The computer-usable medium of claim 24, wherein said first signal directs said external element to begin an independent test of an internal design component of said system-on-chip design.

26. The computer-usable medium of claim 23, wherein said device is further coupled to an external interface of an internal component of said system-on-chip design, and said software generates a signal via said internal component to said device, and monitors said device to determine whether said signal was correctly generated.

27. The computer-usable medium of claim 26, wherein said software generates a signal via said device to said internal component, and monitors said internal component to determine whether said signal was correctly generated.

28. A hardware description language logic device for coupling between a system-on-chip and an element external to said system-on-chip, wherein said system-on-chip generates a first signal to said external element, and said device receives said first signal and applies it to said external element.

29. The logic device of claim 28, wherein said device receives a second signal from said external device responsive to said first signal and relays it to said system-on-chip.

30. The logic device of claim 28, wherein said system-on-chip monitors the status of said external element using said device.

31. The logic device of claim 28, wherein said device is coupled to said system-on-chip device via a chip-external bus, said device having internal logic comprising:

external bus interface logic coupled to said chip-external bus, for interpreting a bus protocol corresponding to said chip-external bus;

command decode logic coupled to said external bus interface logic for interpreting said first signal; and driving means coupled to said command decode logic and an internal bus, for receiving an interpreted signal from said command decode logic and driving said interpreted signal onto said internal bus, said internal bus being coupled to said external element.

32. The logic device of claim 31, wherein said driving means comprises:

an output register coupled to a driver, for applying a data portion of said interpreted signal to said driver; and a driver enable register further coupled to said driver, for enabling and disabling the driving of said data portion by said driver onto said internal bus.

33. The logic device of claim 31, wherein said command decode logic is coupled to said internal bus, for receiving said second signal and relaying it to said software.

34. The logic device of claim 31, wherein said internal logic further includes:

a positive edge detect register coupled to said internal bus and said command decode logic, for capturing positive edge transitions on said internal bus; and a negative edge detect register coupled to said internal bus and said command decode logic, for capturing negative edge transitions on said internal bus;

said positive and negative edge detect registers being coupled to a reset input from said command decode logic, for resetting said registers.

35. The logic device of claim 28 wherein the logic device is a physical device.

36. The logic device of claim 35, wherein said device receives a second signal from said external device responsive to said first signal and relays it to said system-on-chip.

37. The logic device of claim 36, wherein said system-on-chip monitors the status of said external element using said device.

38. The logic device of claim 36, wherein said device is coupled to said system-on-chip device via a chip-external bus, said device having internal logic comprising:

external bus interface logic coupled to said chip-external bus, for interpreting a bus protocol corresponding to said chip-external bus;

command decode logic coupled to said external bus interface logic for interpreting said first signal; and driving means coupled to said command decode logic and an internal bus, for receiving an interpreted signal from said command decode logic and driving said interpreted signal onto said internal bus, said internal bus being coupled to said external element.

39. The logic device of claim 38, wherein said driving means comprises:

an output register coupled to a driver, for applying a data portion of said interpreted signal to said driver; and a driver enable register further coupled to said driver, for enabling and disabling the driving of said data portion by said driver onto said internal bus.

40. The logic device of claim 38, wherein said command decode logic is coupled to said internal bus, for receiving said second signal and relaying it to said software.

41. The logic device of claim 38, wherein said internal logic further includes:

a positive edge detect register coupled to said internal bus and said command decode logic, for capturing positive edge transitions on said internal bus; and a negative edge detect register coupled to said internal bus and said command decode logic, for capturing negative edge transitions on said internal bus;

said positive and negative edge detect registers being coupled to a reset input from said command decode logic, for resetting said registers.

\* \* \* \* \*